US006146156A

United States Patent [19]

Yang

[11] Patent Number: 6,146,156

[45] Date of Patent: Nov. 14, 2000

[54] ELECTRICAL CONNECTOR

[75] Inventor: Sheng-Ho Yang, Taipei, Taiwan

[73] Assignee: Advanced Connecteck Inc., Taipei, Taiwan

[21] Appl. No.: 09/281,006

[22] Filed: Mar. 30, 1999

[30] Foreign Application Priority Data

Nov. 10, 1998 [TW] Taiwan ................................ 87218667

[51] Int. Cl.[7] ................................ H05K 1/00; H01R 4/02

[52] U.S. Cl. ................................ 439/83; 439/876

[58] Field of Search ................................ 439/83, 876, 58, 439/78, 82

[56] References Cited

U.S. PATENT DOCUMENTS

| | | | |
|---|---|---|---|
| 4,645,287 | 2/1987 | Olsson | 339/125 |
| 5,188,535 | 2/1993 | Bertho et al. | 439/83 |
| 5,476,389 | 12/1995 | Ono | 439/83 |
| 5,653,601 | 8/1997 | Martucci et al. | 439/82 |

*Primary Examiner*—Brian Sircus
*Assistant Examiner*—Chandrika Prasad
*Attorney, Agent, or Firm*—Finnegan, Henderson, Farabow, Garrett & Dunner, L.L.P.

[57] ABSTRACT

An electrical connector is adapted for mounting on a printed circuit board having mounting holes with corresponding solder pads on a surface of the printed circuit board. The electrical connector includes a dielectric body and two conductive members mounted on the dielectric body. The dielectric body has top and bottom faces, two receiving holes extending from the top face to the bottom face, and two hollow protrusions formed respectively on the bottom face of the dielectric body in communication with the receiving holes and adapted to extend respectively into the mounting holes of the printed circuit board for preventing solder material from wicking into the receiving holes. Each of the conductive members has two leg portions extending at two sides of a respective one of the hollow protrusions and adapted to be connected to a corresponding one of the solder pads on the printed circuit board, and a compliant mating portion extending into a corresponding one of the receiving holes of the dielectric body for resiliently engaging a mating terminal pin member.

3 Claims, 4 Drawing Sheets

ELECTRICAL CONNECTOR

BACKGROUND OF THE INVENTION

1. Field of the Invention

This invention relates to the art of electrical connectors, more particularly to an electrical connector which prevents molten solder material from wicking or creeping along the electrical connector when locating the electrical connector on an underlying printed circuit board.

2. Description of the Related Art

In hand held and portable electronic devices, such as cellular phones and pagers, the trend is toward smaller and more compact designs to minimize the size and weight of the device and to allow for increased density of the electronic circuitry mounted on the printed circuit boards within the devices. Therefore, it is important to maximize the density of such devices by mounting components and connectors on both surfaces of the circuit boards, and by minimizing the distance between the printed circuit board and the connector mounted thereon. However, if components or connectors, in particular the component or connector terminals, are placed too close to the surface of the printed circuit board, reflow soldering during processing of the board may cause "solder-wicking" of the molten solder or spreading of the reflowed solder into exposed surfaces of the connector terminals.

The "creeping" or wicking of the solder at the terminal can interfere with the electrical connection between the connector terminals and mating component leads by increasing the insertion force of a mating pin or blocking insertion altogether, by causing solder bridging and/or short circuits with the terminal. Therefore, to minimize the risk of solder-wicking in these electronic devices, the known designs typically call for spacing the connector or component away from the surface of the circuit board to create a gap which minimizes the exposed surface of a terminal along which the molten solder can flow. However, this approach is not necessarily consistent with the trend toward high density and compact miniaturized devices, since the gap between the circuit board and the connector takes up valuable space.

SUMMARY OF THE INVENTION

The object of the present invention is to provide an electrical connector that prevents solder material from wicking into the electrical connector.

In the exemplary embodiment of the present invention, the electrical connector is adapted for mounting on a printed circuit board. The printed circuit board has mounting holes with corresponding solder pads on a surface of the printed circuit board. The electrical connector includes a dielectric body and two conductive members mounted on the dielectric body. The dielectric body has top and bottom faces, two receiving holes extending from the top face to the bottom face, and two hollow protrusions formed respectively on the bottom face of the dielectric body in communication with the receiving holes and adapted to extend respectively into the mounting holes of the printed circuit board for preventing solder material from wicking into the receiving holes.

Each of the conductive members has two leg portions extending at two sides of a respective one of the hollow protrusions and adapted to be connected to a corresponding one of the solder pads on the printed circuit board, and a compliant mating portion extending into a corresponding one of the receiving holes of the dielectric body for resiliently engaging a mating terminal pin member.

BRIEF DESCRIPTION OF THE DRAWINGS

Other features and advantages of the present invention will become apparent in the following detailed description of the preferred embodiment of the invention, with reference to the accompanying drawings, in which.

DETAILED DESCRIPTION OF THE PREFERRED EMBODIMENT

Figure 1:
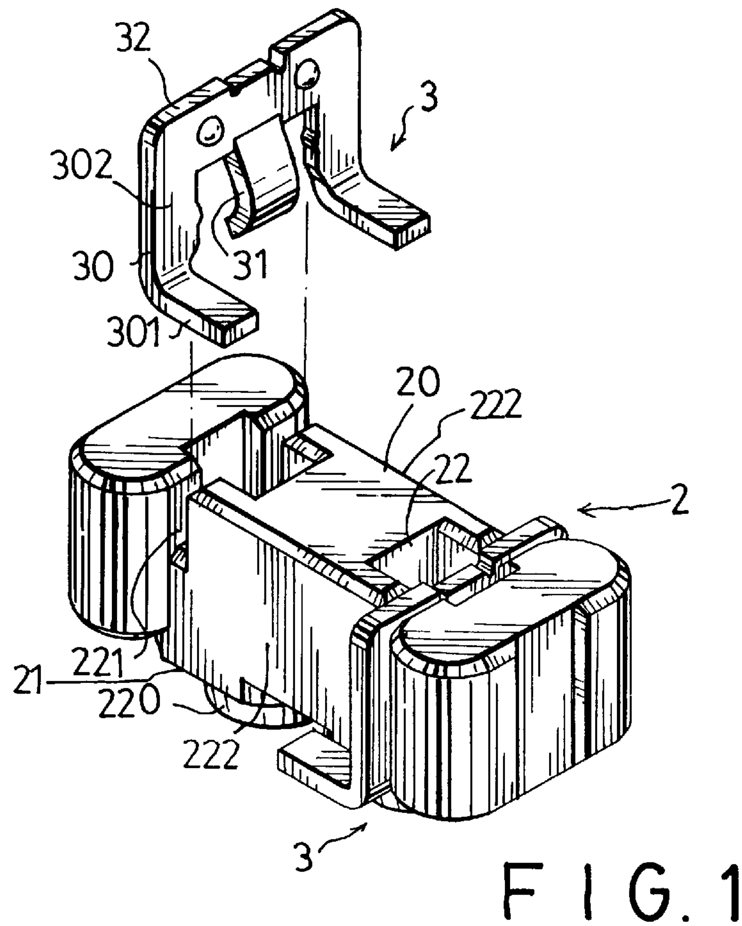
FIG. 1 is an exploded perspective view of a preferred embodiment of an electrical connector according to the present invention.
Figure 2:
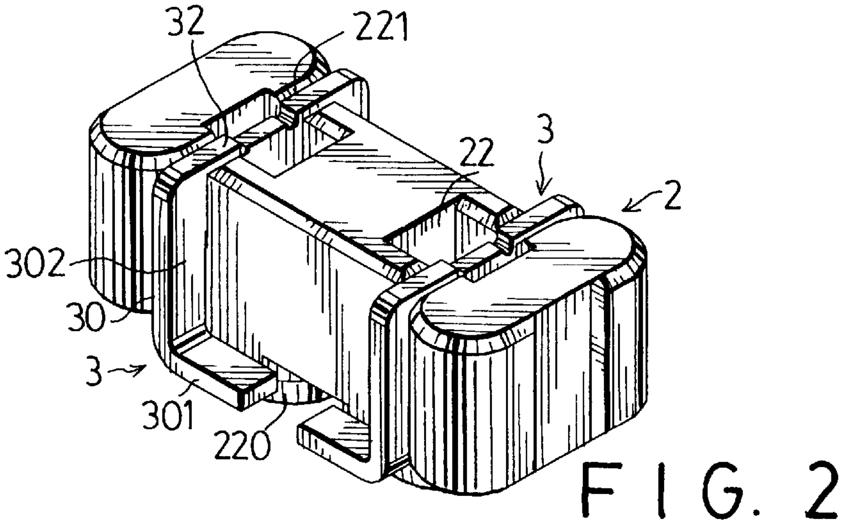
FIG. 2 is a perspective view of the preferred embodiment in assembled condition.
Figure 3:
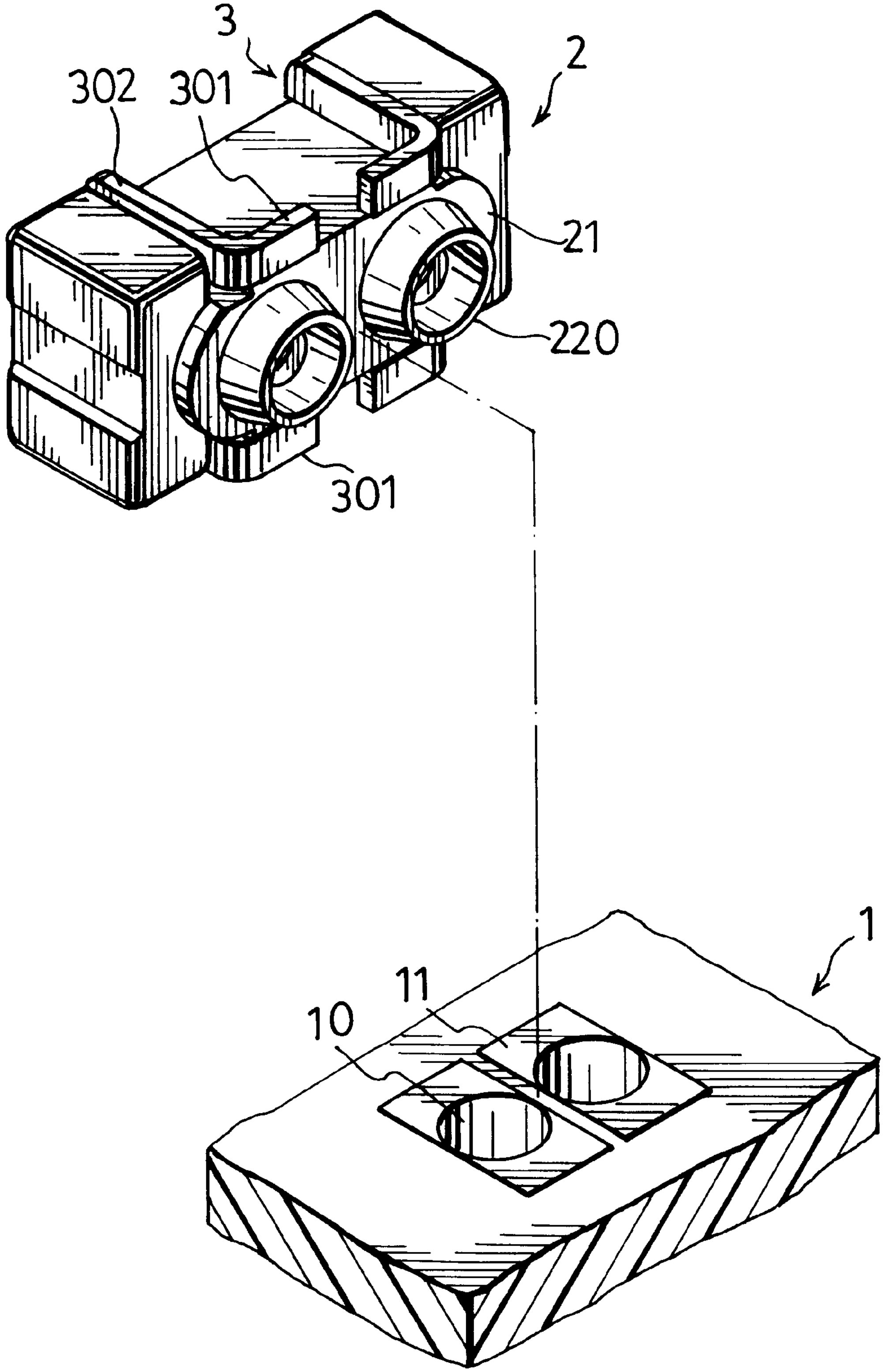
FIG. 3 is a perspective view of the preferred embodiment to be positioned on a printed circuit board having two mounting holes therein.

Referring to FIGS. 1 and 2, the preferred embodiment of an electrical connector according to the present invention is shown to comprise a dielectric body 2 and two E-shaped conductive members 3 mounted on the dielectric body 2. The electrical connector is shown in conjunction with a printed circuit board 1 in FIGS. 3, 4, 5 and 6. The printed circuit board 1 has two mounting holes 10 formed therethrough and two corresponding solder pads 11 adjacent to the mounting holes 10 on a surface of the printed circuit board 1. Each of the solder pads 11 is elongated, as best illustrated in FIG. 3, to form two welding areas on diametrically opposite sides of the corresponding one of the mounting holes 10.

Figure 5:
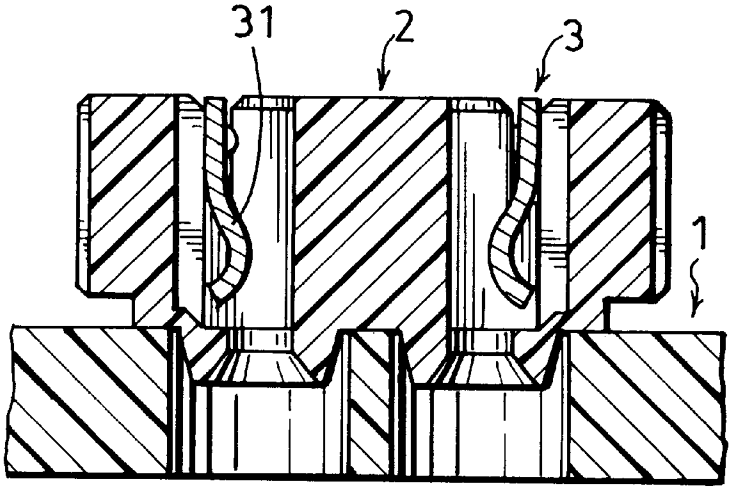
FIG. 5 is a fragmented vertical section taken generally along line A—A of FIG. 4.
Figure 6:
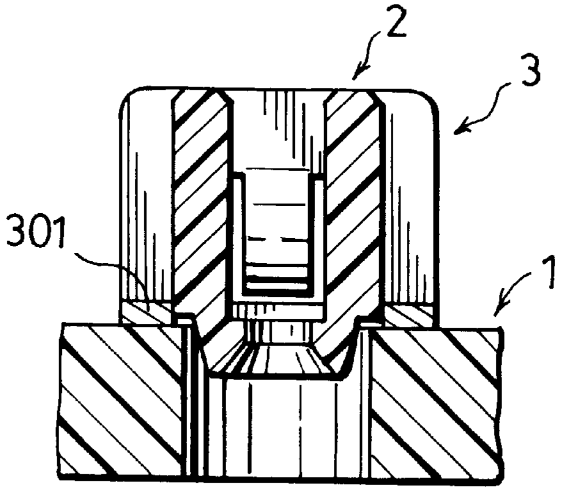
FIG. 6 is a fragmented vertical section taken generally along line B—B of FIG. 4.

The dielectric body 2 has two receiving holes 22 extending through top and bottom faces 20, 21. The bottom face 21 of the dielectric body 2 has two annular hollow protrusions 220 formed thereon. Each of the protrusions 220 is communicated coaxially with a respective one of the receiving holes 22, and is insertable into a corresponding one of the mounting holes 10 on the printed circuit board 1 when the dielectric body 2 is mounted on the printed circuit board 1, as best illustrated in FIGS. 5 and 6. The hollow protrusions 220 are sized and configured to ensure that molten solder material cannot flow or enter into the receiving holes 22.

Each of the conductive members 3 has two leg portions 30 that extend at two sides of a corresponding one of the hollow protrusions 202 and that are connectable to a corresponding one of the solder pads 11 on the printed circuit board 1 during processing of the printed circuit board 1, for example, in a reflow soldering process. Each of the conductive members 3 further has a compliant mating portion 31 extending into a corresponding one of the receiving holes 22 of the dielectric body 2 for resiliently engaging a mating terminal pin member (not shown), and an elongated bridge portion 32 extending transversely of and interconnecting the compliant mating portion 31 and the leg portions 30. The conductive members 3 are stamped and formed of a sheet metal material. As shown, the compliant mating portion 31 of each of the conductive members 3 is formed as a resilient finger that is disposed intermediately of the leg portions 30.

The dielectric body 2 further has two pairs of notches 221 formed respectively on two opposite side faces 222 that interconnect the top and bottom faces 20, 21 and extending from the top face 20 toward the bottom face 21 of the dielectric body 2. Each pair of notches 221 are communicated with a respective one of the receiving holes 22 at two opposites sides of the latter. The bridge portion 32 of each of the conductive members 3 bridges the side faces 222, and has two end portions received in a corresponding pair of notches 221 in order to position securely the conductive members 3 on the dielectric body 2. Each of the leg portions 30 is L-shaped and has a vertical section 302 that is connected to a respective one of the end portions of the bridge portion 32 outwardly of a respective one of the side faces 222, and a horizontal section 301 that is connected to the vertical section 302 and that extends along the respective one of the side faces 222 of the dielectric body 2 adjacent to the bottom face 21.

Figure 4:
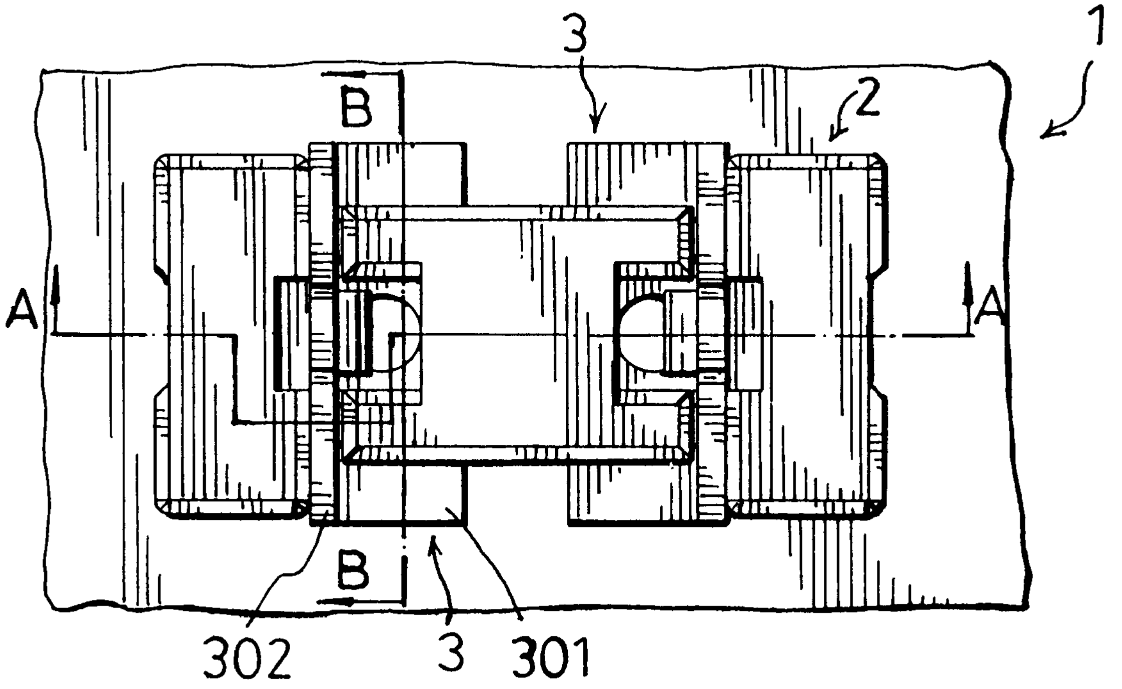
FIG. 4 is a top view of the preferred embodiment that is mounted to the printed circuit board having two mounting holes.

It is noted that, with reference to FIG. 4, the length of the horizontal section 301 of each of the leg portions 30 that extends along a first direction parallel to the side faces 222 is greater than a short width that extends along a second direction perpendicular to the first direction. Therefore, the horizontal sections 310 of the leg portions 30 and the solder pads 11 on the printed circuit board 1 can have a contact area that is sufficient to ensure firm connection therebetween by virtue of increasing the length of the horizontal sections 301 to be welded on the printed circuit board 1, but increasing slightly the overall width of the dielectric body 2. This design contemplates that the electrical connectors of the present invention be placed on the surface of the printed circuit board 1 without taking up valuable space to maximize the density thereof. In addition, since the lower ends of the receiving holes 22 of the dielectric body 2 are surrounded by the hollow protrusions 220, molten solder cannot wick or creep into the receiving holes 22.

While the present invention has been described in connection with what is considered the most practical and preferred embodiment, it is understood that this invention is not limited to the disclosed embodiment but is intended to cover various arrangements included within the spirit and scope of the broadest interpretations and equivalent arrangements.

I claim:

1. An electrical connector comprising:

a dielectric body having top and bottom faces, opposite side faces interconnecting said top and bottom faces, a receiving hole extending from said top face to said bottom face between said side faces, and a pair of notches formed respectively in said side faces in communication with said receiving hole adjacent to said top face, said notches being open at said top face and;

a conductive member mounted on said dielectric body and including an elongated bridge portion extending across said receiving hole and fittingly inserted into said notches, two leg portions extending downward from said bridge portion along said side faces and abutting with outer surfaces of said side faces, and a compliant mating portion extending into said receiving hole from said bridge portion between said leg portions, said bridge portion and said leg portions extending substantially in a common plane transverse to said side faces, said compliant mating portion being bent from said bridge portion to project from said common plane to an extent and then curved backward to form a curved contact part adapted to resiliently contact against a mating connector, said leg portions having horizontal sections extending substantially in the same plane as said bottom face adjacent to said side faces, the horizontal sections being adapted to be soldered to a printed circuit board.

2. The electrical connector as claimed in claim 1, wherein said dielectric body further has a hollow protrusion projecting downward from said bottom face in communication with said receiving hole and adapted to extend into a mounting hole of the printed circuit board.

3. The electrical connector as claimed in claim 1, wherein said horizontal sections of said leg portions project from said common plane in the direction of said side faces and are elongated along said side faces.

* * * * *